US007746155B2

(12) United States Patent
Labbe

(10) Patent No.: US 7,746,155 B2
(45) Date of Patent: Jun. 29, 2010

(54) CIRCUIT AND METHOD FOR TRANSISTOR TURN-OFF WITH STRONG PULLDOWN

(75) Inventor: Eric Labbe, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 51 days.

(21) Appl. No.: 11/094,064

(22) Filed: Mar. 30, 2005

(65) Prior Publication Data

US 2006/0220699 A1    Oct. 5, 2006

(51) Int. Cl.
*H03K 17/56* (2006.01)
(52) U.S. Cl. .................. 327/423; 327/424; 327/427; 327/434; 327/437
(58) Field of Classification Search .................. None
See application file for complete search history.

(56) References Cited

U.S. PATENT DOCUMENTS

| 5,467,242 | A | * | 11/1995 | Kiraly | ............................ | 361/94 |
| 5,625,312 | A | * | 4/1997 | Kawakami et al. | ............ | 327/483 |
| 6,329,866 | B1 | * | 12/2001 | Watarai | ....................... | 327/379 |
| 6,496,036 | B2 | * | 12/2002 | Kan | ............................. | 326/58 |
| 7,023,681 | B2 | * | 4/2006 | Kitahara et al. | .............. | 361/118 |
| 7,170,324 | B2 | * | 1/2007 | Huber et al. | ................. | 327/170 |
| 7,292,087 | B2 | * | 11/2007 | Cappon | ...................... | 327/423 |
| 2003/0112042 | A1 | * | 6/2003 | Takahashi | .................... | 327/112 |
| 2006/0001458 | A1 | * | 1/2006 | Nii | ............................... | 327/112 |
| 2006/0012406 | A1 | * | 1/2006 | Huber et al. | ................. | 327/112 |
| 2009/0174439 | A1 | * | 7/2009 | Luo et al. | .................... | 327/108 |

* cited by examiner

*Primary Examiner*—Tuan Lam
*Assistant Examiner*—Hiep Nguyen
(74) *Attorney, Agent, or Firm*—John J. Patti; Wade J. Brady, III; Frederick J. Telecky, Jr.

(57) ABSTRACT

In accordance with the present invention, there is provided a circuit and method for providing a switchable strong pulldown for a power FET in an off state to avoid inadvertent or false turn ons. A strong pulldown is provided to the gate of a power FET to avoid inadvertent turn on during output swings. In other cases, the gate of the power FET is pulled down weakly to reduce EMI and voltage noise in the circuit. In a particular exemplary embodiment, the present invention provides a circuit and method for obtaining a strong pulldown on the gate of a power FET in an off state, while providing a weak pulldown during turn on to turn off transitions. The invention avoids false turn ons during fast output transitions while maintaining relatively high EMI protection.

3 Claims, 5 Drawing Sheets

CIRCUIT AND METHOD FOR TRANSISTOR TURN-OFF WITH STRONG PULLDOWN

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

1. Field of the Invention

The present invention relates generally to operation of power transistors in fast switching environments, and relates more particularly to maintaining a power FET in an off condition through current and voltage spikes.

2. Description of Related Art

Power FETs are often used in power control applications due to their low on resistance and reasonably fast switching times. Power FETS are often configured in a totem pole or half bridge arrangement to control power supplied to an output based on a given DC power input. A standard configuration is illustrated in circuit 10 in FIG. 1. This traditional switching output stage can be composed of N type DMOS power FETS, where the highs and low side power FETs 12,13, respectively, alternately switch output node OUT between VDD and GND. FETs 12, 13 are also controlled by drivers 14, 15 that are powered by batteries or power supplies BAT1 and BAT2. The switching configuration where both power FETs 12 and 13 are turned on at the same time is avoided in the operation of circuit 10 to prevent a large current flow between VDD and GND. If both power FETS 12 and 13 are on at the same time, circuit 10 dissipates a large amount of power, sinks a large amount of current and eventually causes power FETs 12 or 13 to fail. This type of undesirable condition when power FETs 12 and 13 are both on is often called shoot through or cross-conduction current.

Due to loading characteristics or other circuit considerations, power FETs 12 and 13 often experience voltage and/or current spikes that may cause disruption in the operation of circuit 10. FIG. 2 illustrates a simplified equivalent circuit of driver 15 as seen by the gate of power FET 13 in an off state. A pulldown equivalent resistance Rn keeps Vgs below the threshold voltage of power FET 13. The output OUT typically has a fast rising edge, which is capacitively coupled, due to the large gate-drain capacitance, to the gate of power FET 13. The capacitive coupling with the fast switching causes voltage spikes to be seen at the gate of power FET 13, as illustrated in FIG. 2. As the equivalent pulldown resistance is small, or weak, the voltage spike on voltage Vgs caused during output voltage swing or fast switching has a negative impact on the operation of power FET 13. If the voltage spike causes gate voltage Vgs to go above the threshold for power FET 13 turn on, voltage Vt, a false turn on of power FET 13 occurs. In such an instance, if power FET 12 is on at the same time, shoot through or cross-conduction current can occur in circuit 10.

When both power FETS 12 and 13 are off, a DC current source connected at output node OUT insures that the output stays low as long as power FETS 12 and 13 are off. If high side power FET 12 is turned on, output OUT rises to a given voltage level, and intrinsic capacitance CGD pulls the voltage of the gate of low side power FET 13 to a level that depends upon the equivalent pull down strength. If the pull down on the gate of low side power FET 13 is weak, such that gate voltage VL or Vgs is equal to or greater than voltage Vt, that is, equal to or greater than the turn on threshold, a large current to GND is observed. The false turn on that results sinks current to GND in the range of a few amps during this output swing.

If the gate of low side power FET 13 is pulled down strongly, low side power FET 13 stays off during the output swing. Low side power FET 13 stays off because gate voltage VL does not rise above threshold voltage Vt.

One advantage to having a weak pull down on the gate of low side power FET 13 is the reduction of EMI or voltage spikes across low side power FET 13. Accordingly, it would be desirable to provide a way to prevent low side power FET 13 from inadvertently turning on, while obtaining the advantages of reduced EMI and noise. It would also be desirable to avoid false turn ons of a power FET in a half bridge configuration, such as that illustrated in circuit 10.

BRIEF SUMMARY OF THE INVENTION

In accordance with the present invention, there is provided a circuit and method for providing a switchable strong pulldown for a power FET in an off state to avoid inadvertent or false turn ons. A strong pulldown is provided to the gate of a power FET to avoid inadvertent turn on during output swings. In other cases, the gate of the power FET is pulled down weakly to reduce EMI and voltage noise in the circuit. In a particular exemplary embodiment, the present invention provides a circuit and method for obtaining a strong pulldown on the gate of a power FET in an off state, while providing a weak pulldown during turn on to turn off transitions. The invention avoids false turn ons during fast output transitions while maintaining relatively high EMI protection.

According to an embodiment of the present invention, a low side FET in a switching half bridge is selectively pulled down with a low impedance. The strong pull down is achieved with a low impedance FET coupled to the gate of the low side FET. By selectively switching the low impedance FET, protection against voltage spikes on the low side FET is achieved to avoid false turn-ons. The low impedance path on the gate of the low side FET ensures the low side FET is maintained in an off state during fast transitions when voltage spikes may occur. Selective application of the strong pull down permits the use of a weak pull down to avoid EMI or voltage spikes during transitions.

In accordance with a feature of the present invention, the low impedance FET may be triggered by a comparator with a certain threshold, or by a current source fed FET that obtains a certain switching threshold.

BRIEF DESCRIPTION OF THE SEVERAL VIEWS OF THE DRAWINGS

The present invention is described in greater detail below, with reference to the accompanying drawings, in which.

DETAILED DESCRIPTION OF THE INVENTION

Figure 1:
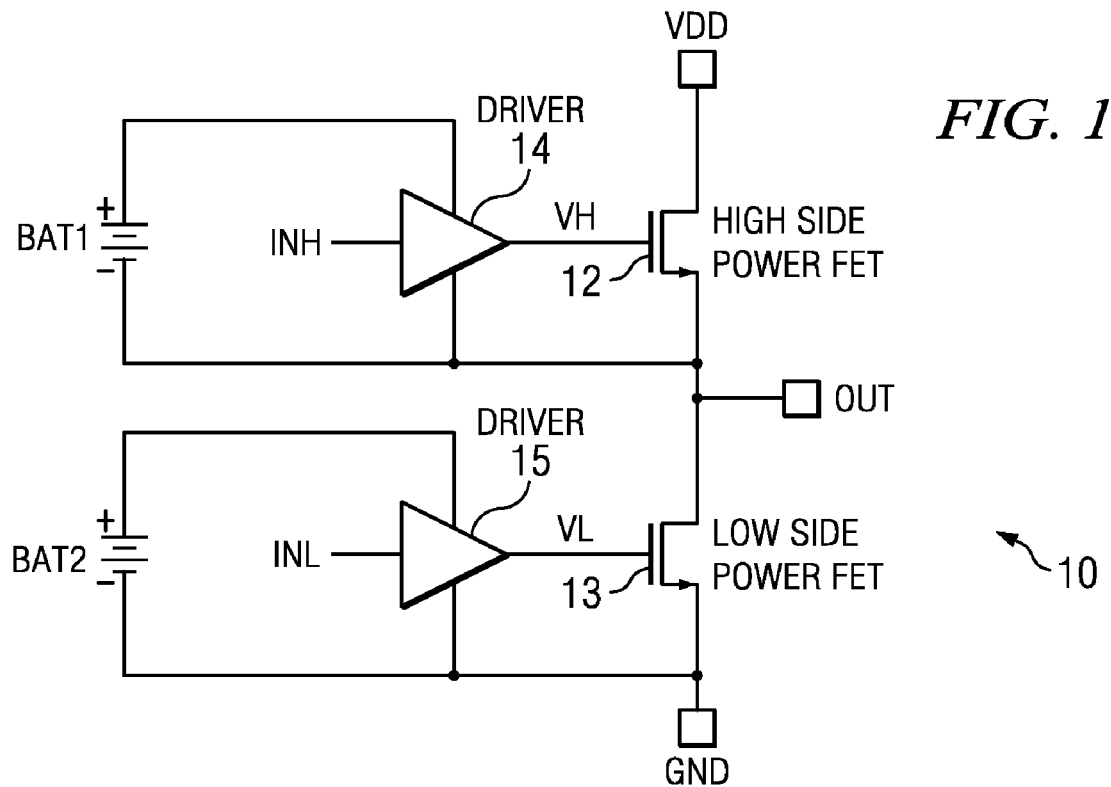
FIG. 1 is a circuit diagram of a known switching half bridge configuration.
Figure 2:
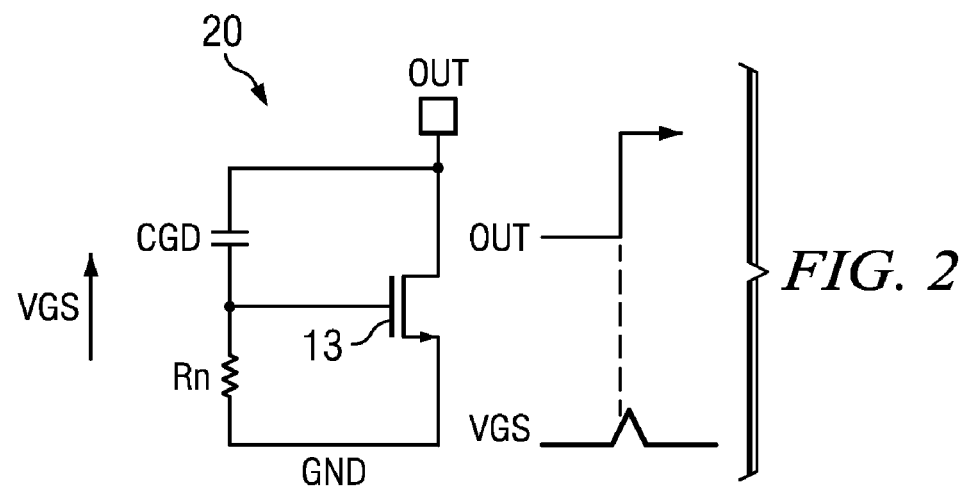
FIG. 2 is a circuit diagram of an equivalent circuit for a FET driver.

The switching half bridge in circuit 10 of FIG. 1 shows a driver 15 supplying a gate voltage to a power FET 13 with a voltage VL. The equivalent circuit for the driver when power FET 13 is off is illustrated in circuit 20 in FIG. 2. The equivalent circuit includes a resistor RN connected between the gate and source of power moss FET 13, and a capacitance CGD connected between the gate and drain of power FET 13. When power FET 13 is in an off state and output OUT experiences a fast transition, a voltage Vgs is observed on the gate of power FET 13. Because the gate of power FET 13 is not pulled down very strongly by driver 15 when power FET 13 is off, voltage Vgs may be greater than a threshold voltage for turning on power FET 13. Because high side power FET 12 may also be on, a large current may be developed through power FETs 12 and 13, resulting in damage to those components.

To avoid the above described problem, the present invention provides a circuit and method for attaining a strong pulldown on the gate of a power FET, when the power FET is off, during switching transitions that may otherwise induce a voltage on the gate of the power FET. According to an exemplary embodiment, the strong pulldown of the gate of the power FET is provided after a turn-on to turn-off switching transition occurs, so that a weak pulldown can be provided during the transition time for the power FET. The weak and strong pulldown of the gate of the power FET can be simulated, and the circuits provided according to the present invention illustrate the advantages provided by the method and circuits according to the present invention.

Figure 3A:
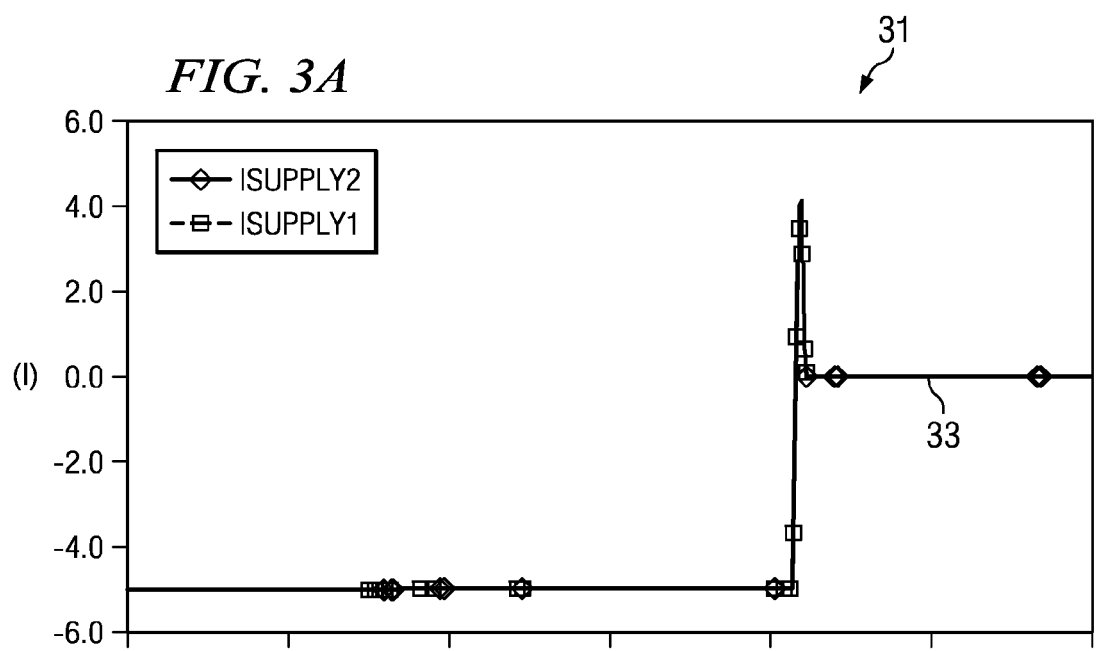
FIGS. 3A-3B are graphs illustrating responses and characteristics of components in a switching half bridge configuration.
Figure 3B:
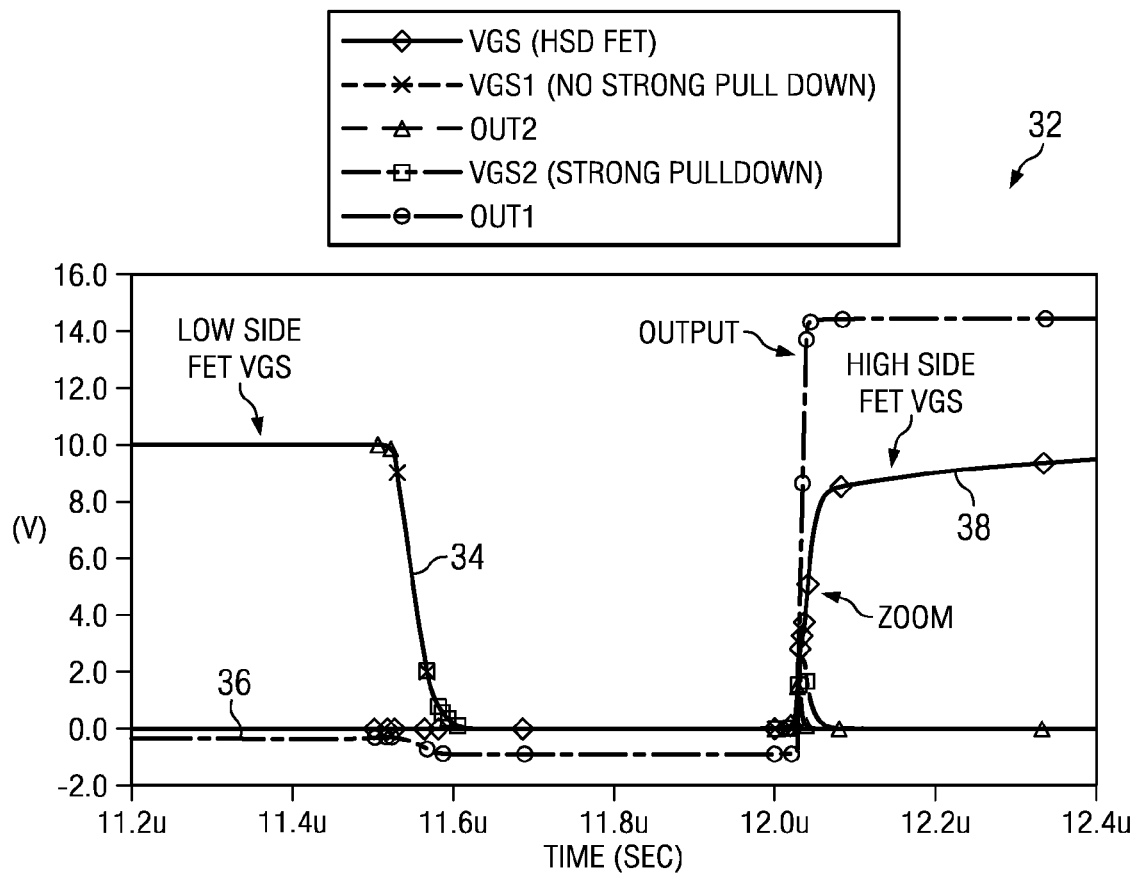

Referring now to FIGS. 3A and 3B, graphs 31 and 32, respectively, illustrate various transient responses. In graph 32, trace 34 illustrates a low side FET turn off with a voltage Vgs that falls from 10 volts to 0 volts over a time period of approximately 1.0 microseconds. Switching the low side FET off causes the output voltage, shown in trace 36, to become slightly more negative. The interval where the low side FET is off does not pose any difficulty for false turn on, until the high side FET turns on, as illustrated in trace 38. When the high side FET turns on, the output voltage jumps to a high positive value of approximately 15 volts, for example. At the same time, trace 33 in graph 31 of FIG. 3A shows a large current spike due to the high inrush current observed when the high side FET turns on. It is the high inrush current and fast voltage switching that causes the difficulty of false turn ons for the low side FET.

Figure 4A:
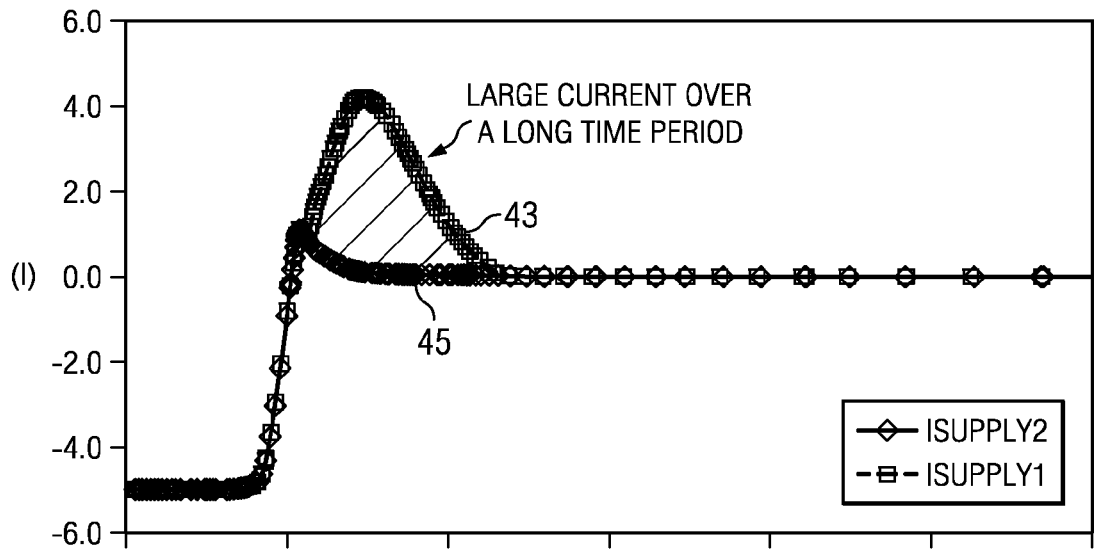
FIGS. 4A-4B are graphs illustrating responses for components in a switching half bridge configuration.
Figure 4B:
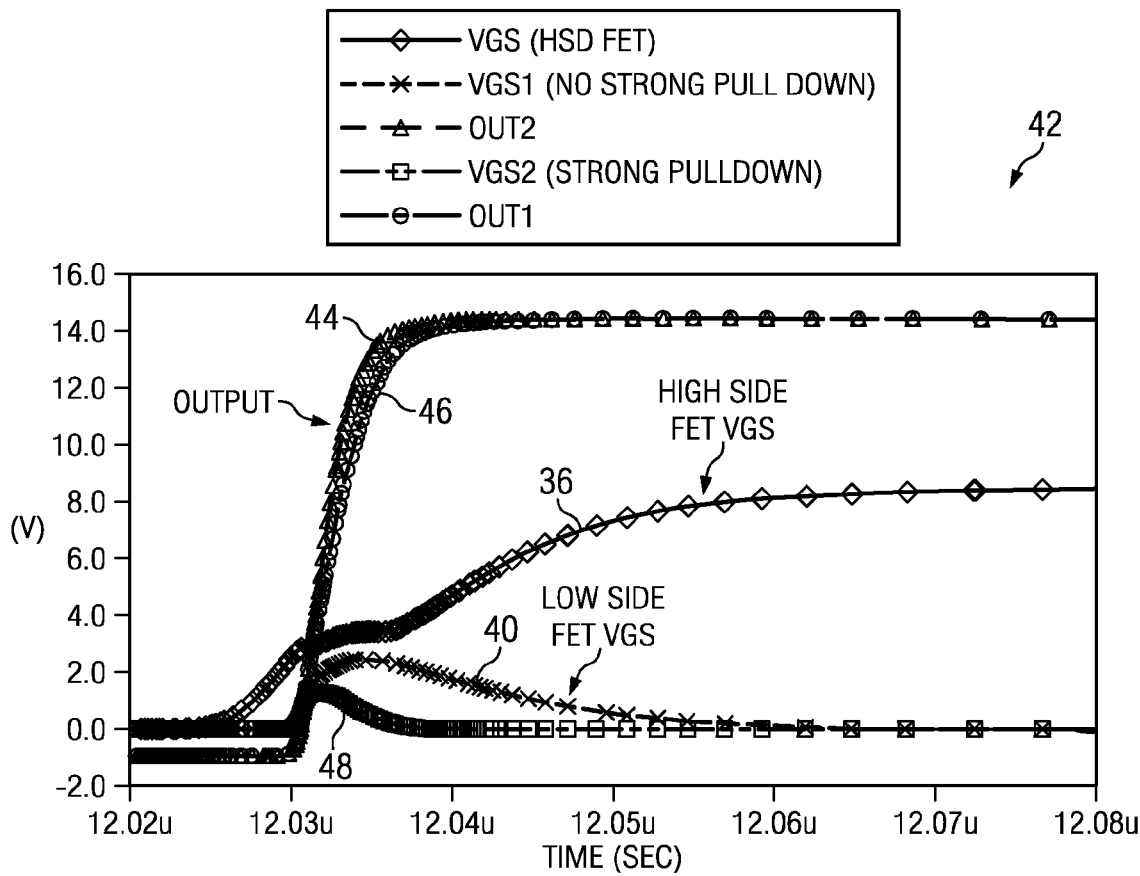

Referring now to FIGS. 4A-4B, expanded time frames for graphs 31 and 32 in the region of approximately 12.02-12.08 microseconds are illustrated in graphs 41 and 42, respectively. Graphs 41 and 42 illustrate traces for both cases of weak pulldown and strong pulldown during fast transitions. In graph 41, trace 43 illustrates the supply current flowing through output OUT when a weak pulldown is used during fast transitions. Similarly, trace 45 illustrates the current supply through output OUT during fast transitions with a strong pulldown on the gate of the low side FET. It is immediately apparent from graph 41 that the weak pulldown results in a large amount of current over a significant amount of time, resulting in excessive power dissipation. In contrast, trace 45 shows the supply current with a strong pulldown during fast transitions, with greatly reduced power dissipation.

Referring to FIG. 4B, graph 42 shows output voltages 44 and 46 taken across the low side FET for the different cases of strong pulldown and weak pulldown, respectively. The gate source voltage on the high side FET is illustrated in trace 36, which shows a turn on threshold of approximately 3.0 volts in graph 42. The turn on of the high side FET initiates a fast transition in output OUT, causing voltage spikes on the gate of the low side FET, illustrated in traces 40 and 48.

Traces 40 and 48 illustrate the voltage spike seen on the gate of the low side FET when a fast transition on output OUT occurs due to the switching of the high side FET. Trace 40 illustrates the transient response on the gate of the low side FET when the gate is pulled down weakly. Trace 48 illustrates the transient response on the gate of the low side FET when the gate is pulled down strongly. As can be seen by the characteristics of traces 40 and 48, the strong pulldown of the gate of the low side FET produces a response that is significantly damped in comparison to the transient response of the weakly pulled down gate, shown in trace 40. The change in pull down characteristics accounts for the large difference in current flow and power dissipation shown in trace 43 of graph 41. The large current flow and power dissipation results from the voltage on the gate of the low side FET approaching the turn on threshold for the FET, which in conjunction with the drain to source voltage, produces the large current sink to ground point GND. However, the strongly pulled down gate of the low side FET, obtains a significantly more damped response and does not approach the threshold voltage for the low side FET, as illustrated in trace 48. The corresponding current flow through output OUT has a greatly reduced overshoot characteristic.

Accordingly, the present invention offers a number of advantages in reduced power dissipation and improved response regarding the half bridge circuit, and, in particular, the low side FET.

A DC current source connected at output OUT draws current out of output OUT to insure that output OUT stays low when both the high and low power FETS in an off state. When the high side power FET turns on, output OUT rises and the equivalent capacitance CGD pulls up the voltage on the gate of the low side FET to a level that depends on the equivalent pull down strength applied to the gate of the low side FET. With a weak pull down, the voltage applied to the gate of the low side FET may rise above the turn on threshold, as indicated in graphs 41 and 42, with traces 43 and 40. In this instance, a large supply current of several amps may be observed through ground GND over the course of the output swing. A strong pull down on the gate of the low side FET insures that the low side FET stays in an off state during the output swing. The strong pull down on the gate of the low side FET prevents the gate voltage from rising above the threshold voltage, so that no large currents are observed through the low side FET, as illustrated in graphs 41 and 42, with traces 45 and 48.

The strong pull down on the gate of the low side FET may be applied any time following the turn off transition of the low side power FET. It may be desirable to maintain the strong pull down on the gate of the low side FET for the entire switching cycle where the low side FET is in an off state. Alternately, a weak pull down may be applied to the gate of the low side FET at particular times to reduce EMI or voltage spikes across the output of the low side FET. In such a case, additional circuitry may be provided to obtain a strong pull down on the gate of the low side FET during sharp transitions in the output, while providing a weak pull down in other intervals to reduce EMI and voltage spikes.

Figure 5:
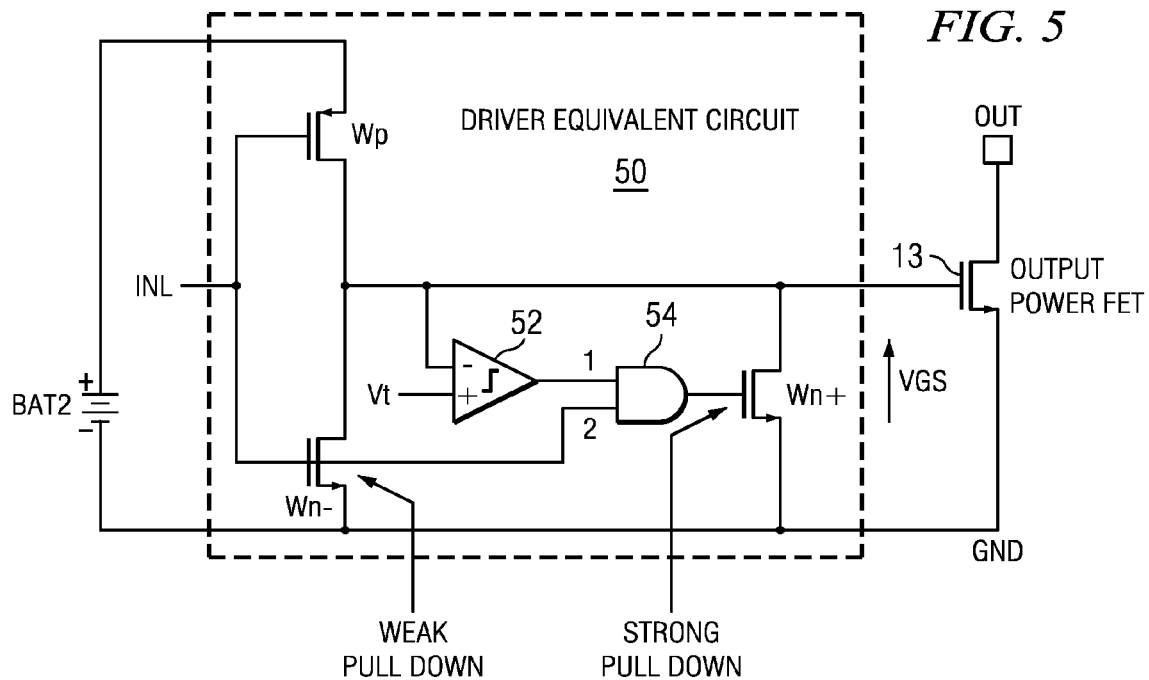
FIG. 5 is a circuit diagram illustrating a driver circuit in accordance with the present invention.

Referring now to FIG. 5, a driver equivalent circuit 50 is illustrated for selectively providing a strong or weak pull down on the gate of power FET 13. Gate signal INL is used to indicate when power FET 13 should be turned on or off. The operation of circuit 50 (which is coupled to power supply BAT2) is explained in the context of changes in signal INL, where signal INL is initially low, so that driver FET WP is conducting and power FET 13 is on. When input INL goes to a high level, FET WP turns off and power FET 13 turns off as well. Driver FET WN− turns on with a high input INL, pulling down the gate of output power FET 13 with a weak pull down. Driver FET WN+ does not turn on because the gate of power FET WN+ is controlled by comparator 52 and AND gate 54. During the process of turning off power FET 13, voltage Vgs drops from an initially high level to a low level. During this transition, the value of voltage Vgs passes the value of threshold voltage Vt. As voltage Vgs drops below threshold voltage Vt, the output of comparator 52 turns on, enabling AND gate 54 and turning on strong pull down FET WN+. In this configuration, the gate of power FET 13 is pulled down strongly to the ground potential GND through the combination of both weak pull down FET WN− and strong pull down FET WN+. In this state, power FET 13 can absorb significant output voltage spikes without negatively impacting the performance of power FET 13, and without producing a large current draw.

In general terms, strong pull down FET WN+ provides a low impedance path to ground GND for the gate of power FET 13. Driver equivalent circuit 50 thus provides for a strong pull down on the gate of power FET 13 once power FET 13 is turned off with a gate voltage below threshold voltage Vt. Threshold voltage Vt is set sufficiently high so that voltage spikes experienced by power FET 13 do not raise voltage Vgs above threshold voltage Vt while power FET 13 is off. Strong pull down FET WN+ enhances the resistance of power FET 13 to high voltage spikes on output OUT because of the low impedance path provided to ground GND.

When input signal INL changes to a low value, FET WP turns on and FET WN− turns off, while AND gate 54 is disabled. As voltage Vgs on the gate of power FET 13 increases through the conduction path provided by FET WP, it rises above threshold voltage Vt. Once voltage Vgs rises above threshold voltage Vt, comparator 52 also turns off and provides a low state output to AND gate 54. Accordingly, both weak and strong pull down transistors WN− and WN+ remain off while output power FET 13 is in an on state. Once power FET 13 is turned off with a high value on input INL, the switching sequence repeats and the gate of power FET 13 is provided with a strong pull down for the duration of the interval for which voltage Vgs falls below threshold voltage Vt and input INL is a high value.

Figure 6:
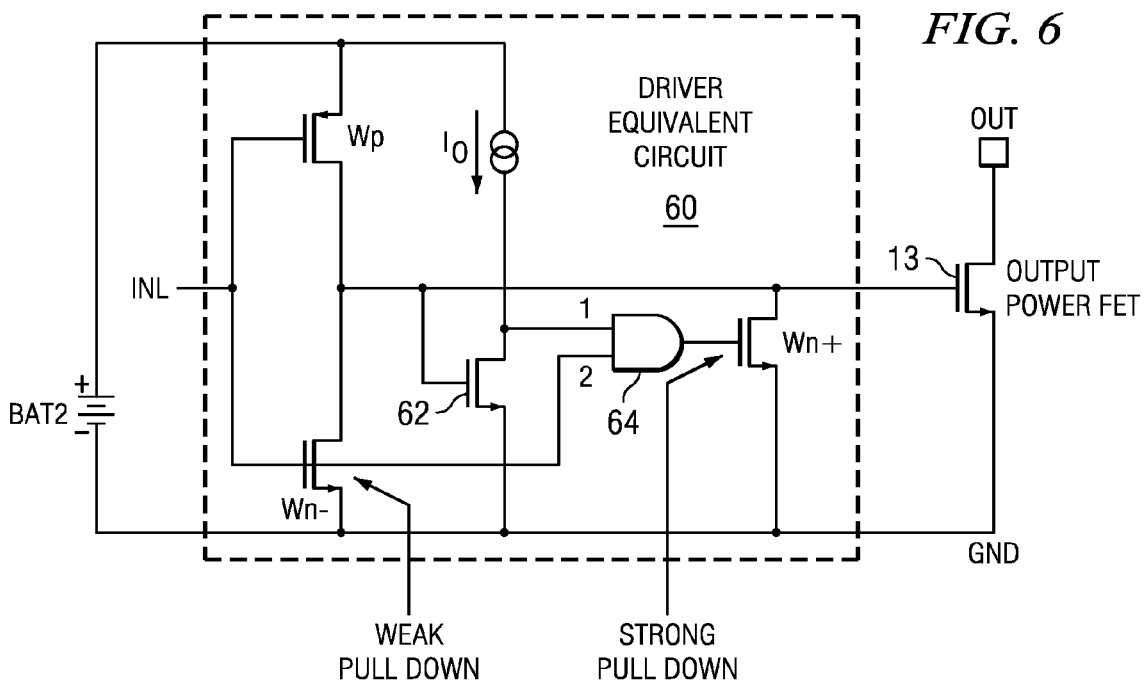
FIG. 6 is a circuit diagram illustrating a driver equivalent circuit in accordance with the present invention.

Referring now to FIG. 6, another embodiment of the present invention is illustrated with driver equivalent circuit 60. Circuit 60 (which is coupled to power supply BAT2) operates similarly to circuit 50 in FIG. 5, with the difference that comparator 52 and threshold voltage Vt are replaced by FET 62 and current source I0. When input INL transitions from a low to a high value to turn off power FET 13, a logic high level is supplied to input 2 of AND gate 64. The logic high level of input INL also turns off P type FET WP, which reduces the voltage on the gate of power FET 13 to ground potential GND. As the voltage on the gate of power FET 13 drops, the voltage on the gate of FET 62 also drops, turning off FET 62. The level at which FET 62 turns off is used as the threshold voltage for turning on the strong pull down. As FET 62 turns off, current source I0 supplies a logic high level to input 1 of AND gate 64. With both inputs 1 and 2 at a logic high level, the output of AND gate 64 turns on strong pull down FET WN+. Weak pull down FET WN− is turned on initially when input INL goes to a high logic level. The combination of the weak and strong pull down on the gate of power FET 13 maintains power FET 13 in an off state even when subjected to voltage spikes between the gate and source. The strong pull down is maintained until input INL transitions to a low logic level, turning off weak pull down FET WN− and supplying a low logic level to input 2 of AND gate 64. The low input level on input 2 of AND gate 64 causes the output of AND gate 64 to go to a low logic level, turning off strong pull down FET WN+. Power FET 13 is turned on during this sequence and both the weak and strong pull down is removed from the gate of power FET 13 while it is in an on state.

The simplified configuration of circuit 60 permits the present invention to be realized more simply and less expensively. In addition, FET 62 can be provided as a portion of power FET 13 when the FETs are laid out in a monolithic structure. For example, FET 62 may be composed of a number of cells of power FET 13 so that both power FET 13 and FET 62 have the same threshold voltage characteristics.

Figure 7A:
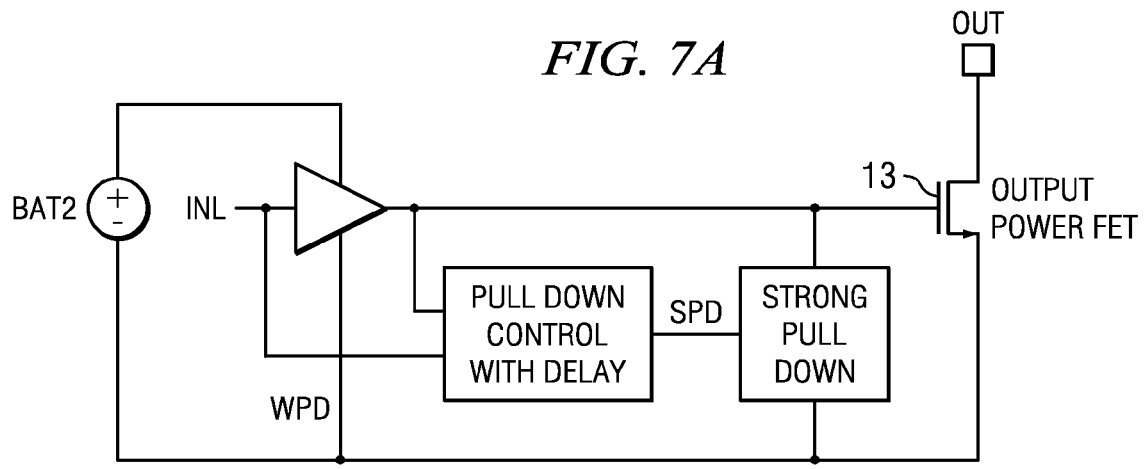
FIG. 7A is a circuit diagram illustrating a driver circuit in accordance with the present invention.
Figure 7B:
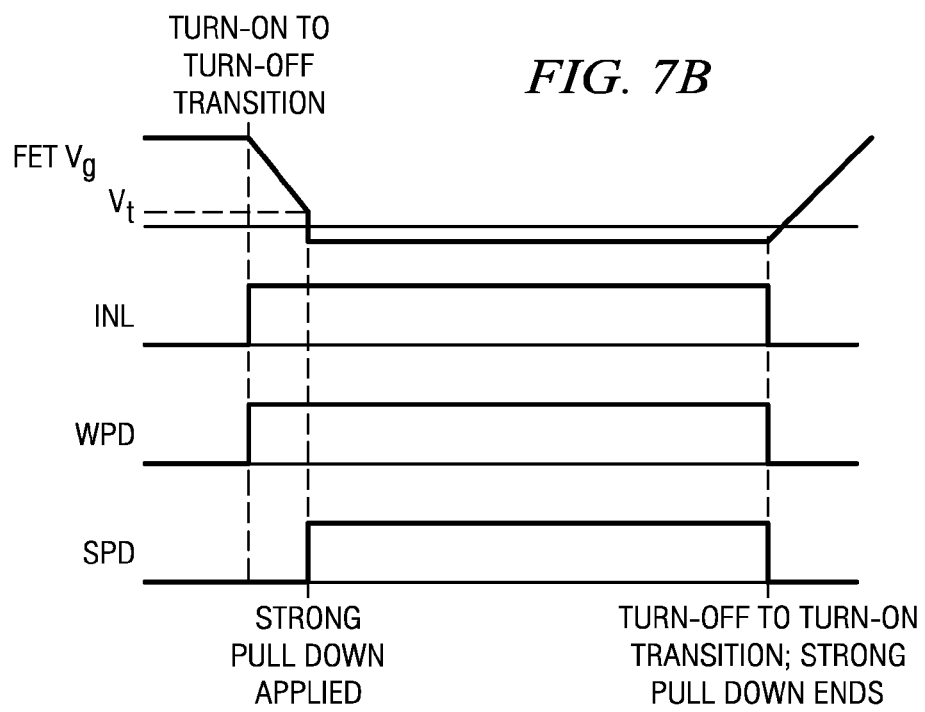
FIG. 7B is a timing diagram illustrating operation of the driver according to the present invention.

In each of the embodiments illustrated in FIGS. 5 and 6, a weak pull down is provided during the turn on to turn off transition for power FET 13. The weak pull down avoids the production of EMI or voltage spikes that might otherwise be caused in the presence of the strong pull down during the turn on to turn off transition. In addition, circuits 50 and 60 can be designed with a delay element provided to turn on strong pull down FET WN+, so that strong pull down FET WN+ turns on when voltage Vgs drops below the desired threshold level, and then turns off after a given interval. This concept is illustrated in FIGS. 7A and 7B.

Strong pull down signal SPD is activated after gate voltage Vg of power FET 13 drops below threshold voltage Vt. Once the strong pull down is activated, a false turn on of power FET 13 due to capacitive coupling in the output commutation is prevented. The gate to drain capacitance of power FET 13 is coupled to a low impedance path to the source potential, or ground, so that voltage spikes supplied to power FET 13 do not cause a high enough voltage on the gate of power FET 13 to induce a turn on. In the exemplary embodiment of FIGS. 7A and 7B, the strong pull down is active when power FET 13 is off and gate voltage Vg drops below threshold voltage Vt. The strong pull down remains active until signal INL goes low, indicating a command to turn power FET 13 back on. When power FET 13 is again turned back off, a weak pull down WPD is initially active. That is, as soon as signal INL goes high, and power FET 13 begins to turn off, the weak pull down is initiated, and is maintained until signal INL goes low again. Accordingly, during the transition of power FET 13 from an on state to an off state, a weak pull down is applied, followed by a strong pull down after the threshold voltage Vt is attained. After voltage Vt is attained, a strong pull down is applied for the duration of the off period. The weak and strong pull down is removed prior to a turn on transition of power FET 13 to avoid impacting the switching speed of power FET 13.

Although the present invention has been described in relation to particular embodiments thereof, other variations and modifications and other uses will become apparent to those skilled in the art from the description. It is intended therefore, that the present invention not be limited by the specific disclosure herein, but to be given the full scope indicated by the appended claims.

What is claimed is:

1. An apparatus comprising:
   an output node;
   a first power supply;
   a second power supply;
   a first node;
   a second node;
   a first NMOS transistor that is coupled to the first node at its drain and the output node at its source;
   a first driver that is coupled to the first power supply and the gate of the first NMOS transistor, wherein the first driver actuates and deactuates the first NMOS transistor, and wherein the first driver receives a first signal;
   a second NMOS transistor that is coupled to the second node at is source and the output node at its drain; and
   a second driver including:
      a drive circuit that receives a second signal and that is coupled to the gate of the second NMOS transistor and the second power supply;
      a current source that is coupled to the second power supply;
      a third NMOS transistor that is coupled to the current source at its drain, the gate of the second NMOS transistor at its gate, and the second node at its source; and
      an AND gate that is coupled to the current source and that receives the second signal; and
      a strong pulldown circuit that is coupled to the AND gate and the gate of the second NMOS transistor.

2. The apparatus of claim 1, wherein the drive circuit further comprises:
   a PMOS transistor that receives the second signal at its gate and that is coupled to the gate of the second NMOS transistor at its drain and the second power supply at its source; and
   a fourth NMOS transistor that receives the second signal at its gate and that is coupled to the gate of the second NMOS transistor at its drain and ground at its source.

3. The apparatus of claim 1, wherein the strong pulldown circuit further comprises a fourth NMOS transistor that is coupled to the AND gate at its gate, the gate of the second NMOS transistor at its drain, and ground at its source.

* * * * *